United States Patent [19]
Pang

[11] Patent Number: 5,963,102
[45] Date of Patent: Oct. 5, 1999

[54] VOLTAGE CONTROLLED OSCILLATOR HAVING A RING OSCILLATOR CIRCUIT

[75] Inventor: Dai Sung Pang, Seoul, Rep. of Korea

[73] Assignee: LG Semicon Co., Ltd., Chungcheongbuk-Do, Rep. of Korea

[21] Appl. No.: 08/998,025

[22] Filed: Dec. 24, 1997

[30] Foreign Application Priority Data

Dec. 30, 1996 [KR] Rep. of Korea ........................ 96-77505

[51] Int. Cl.[6] .................................................... H03B 5/24
[52] U.S. Cl. ........................... 331/57; 331/74; 331/177 R
[58] Field of Search .................... 331/34, 57, 74, 331/177 R; 327/277, 281

[56] References Cited

U.S. PATENT DOCUMENTS

| | | | |
|---|---|---|---|
| 5,485,126 | 1/1996 | Gersbach et al. | 331/57 |
| 5,491,441 | 2/1996 | Goetschel et al. | 327/291 |
| 5,512,861 | 4/1996 | Sharma | 331/74 |
| 5,559,473 | 9/1996 | Anderson et al. | 331/34 |
| 5,594,391 | 1/1997 | Yoshizawa | 331/57 |

OTHER PUBLICATIONS

Chauhan, A.S. et al; "Pulse Generation Employing Saturation–Controlled Transistor Inverters"; *Int. J. Electronics, 1982, vol. 53, No. 3*.; Sep. 1982, pp. 223–232.

*Primary Examiner*—David Mis
*Attorney, Agent, or Firm*—Morgan, Lewis & Bockius LLP

[57] ABSTRACT

A voltage controlled oscillator (VCO) includes a ring oscillator controlled by an input voltage and having a ring structure, the ring oscillator including a plurality of CMOS inverter amplifiers each having an input and an output, the output of a CMOS inverter amplifier being connected to the input of a next CMOS inverter amplifier, and an inverter for inverting an output value of the ring oscillator.

17 Claims, 3 Drawing Sheets

VOLTAGE CONTROLLED OSCILLATOR HAVING A RING OSCILLATOR CIRCUIT

This application claims the benefit of Korean Application Number 77505/1996 filed on Dec. 30, 1996, which is hereby incorporated by reference.

BACKGROUND OF THE INVENTION

1. Field of the Invention

The present invention relates to a voltage controlled oscillator (VCO), and more particularly, to an improved voltage controlled oscillator capable of generating a high frequency with regard to a semiconductor chip operated at a low voltage.

2. Description of the Prior Art

A conventional VCO, as shown in FIG. 1, includes a PMOS transistor 10 with its source connected to a supply voltage VDD and with its gate connected to an input voltage Vin. The conventional VCO also includes a ring oscillator 11 having a plurality of CMOS inverters connected in parallel with each other between the drain of the PMOS transistor 10 and a ground voltage Vss. An inverter 12 inverts the output value from the ring oscillator 11.

The plurality of CMOS inverters in the ring oscillator 11 each respectively includes a PMOS transistor and an NMOS transistor connected in series with each other between the PMOS transistor 10 and the ground voltage Vss. In addition, the output of the last inverter is fed back to the input of the first inverter.

The operation of the conventional VCO will now be described. When the input voltage Vin shifts from 0V to 5V, the PMOS transistor 10 is turned off, thus blocking the supply voltage VDD so that it is not applied to the ring oscillator 11. This results in a change of the equivalent resistance of the plurality of inverters in the ring oscillator 11 and a free running frequency of the inverters. Therefore, a frequency responding to the input voltage Vin can be obtained.

However, in the conventional VCO, the PMOS transistors in the ring oscillator 11 are connected in series with the drain of the PMOS transistor 10 so that it is impossible to operate the VCO at a voltage less than 3V due to the threshold voltage value Vt of the PMOS transistors.

Further, because the PMOS transistor 10 initially lowers the supply voltage VDD, a high frequency cannot be obtained at a chip voltage with regard to the inverters forming the ring oscillator 11.

SUMMARY OF THE INVENTION

Accordingly, the present invention is directed to a Voltage Controlled Oscillator that substantially obviates one or more of the problems due to limitations and disadvantages of the related art.

An object of the present invention is to provide a voltage controlled oscillator (VCO) for satisfying an oscillation function at a lowest voltage during a low voltage operation of a semiconductor chip.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the voltage controlled oscillator (VCO) includes a ring oscillator controlled by an input voltage and having a ring structure, wherein an output value of a first CMOS inverter amplifier is applied to a next CMOS inverter amplifier, and an inverter for inverting an output value of the ring oscillator 11.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
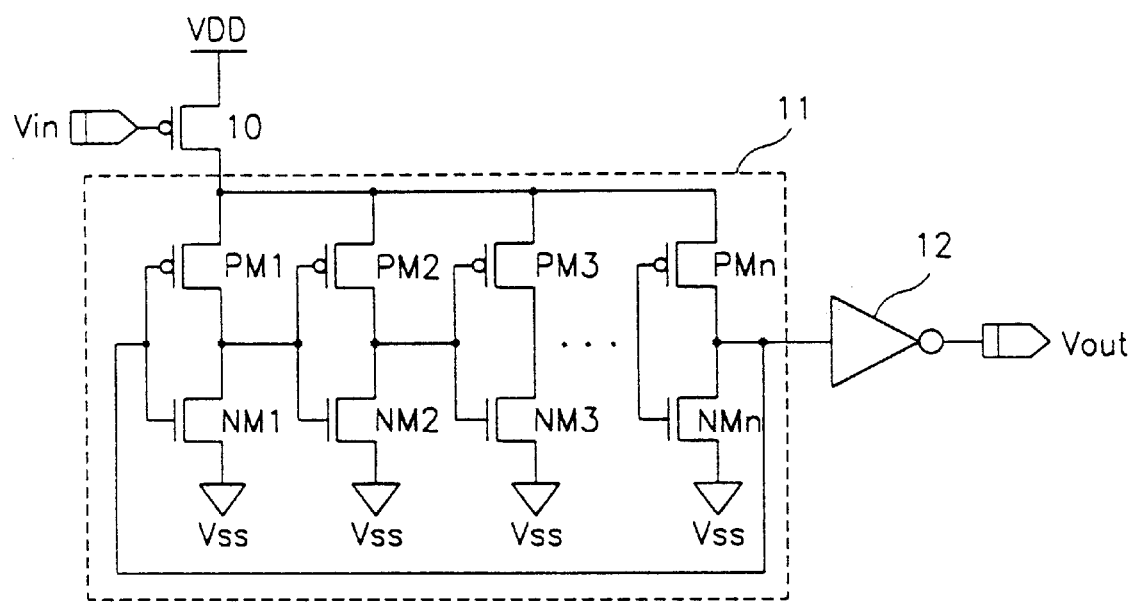
FIG. 1 is a schematic circuit diagram of a conventional voltage controlled oscillator.
Figure 2:
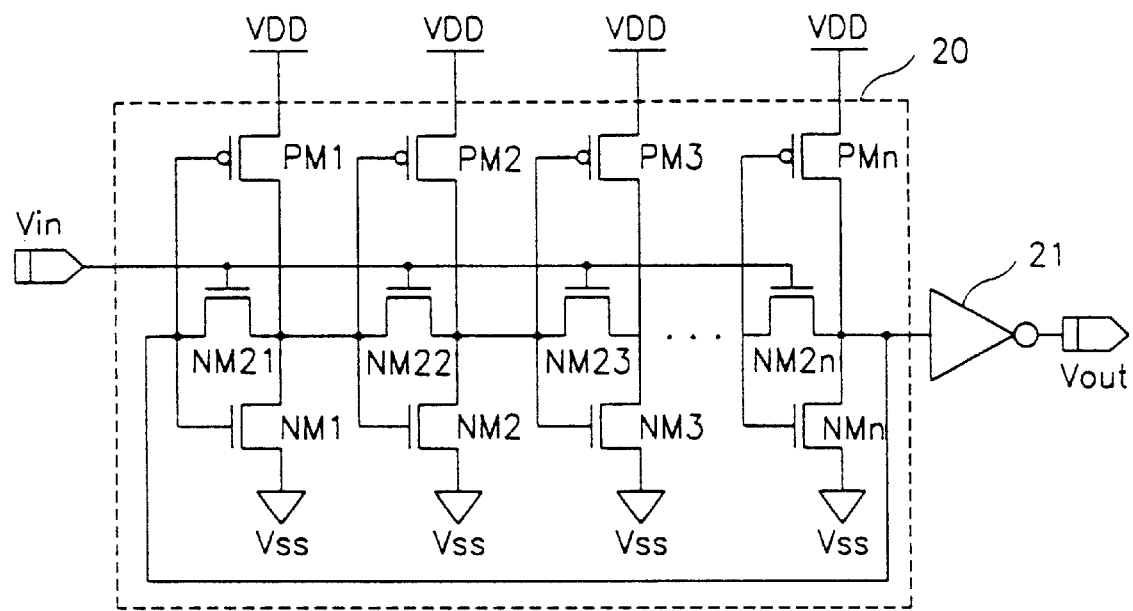
FIG. 2 is a schematic circuit diagram of a voltage controlled oscillator according to the present invention.

As shown in FIG. 2, a voltage controlled oscillator (VCO) includes a ring oscillator 20 forming a ring structure, and an inverter 21 for inverting the output value of the ring oscillator 20. The ring oscillator 20 includes a plurality of CMOS inverters. An output value of a first inverter is applied to an input of a second CMOS inverter, and similar connections are made between other CMOS inverters. An output value of the last CMOS inverter is fed back to the input of the first CMOS inverter, as well as being outputted as the output value of the ring oscillator 20. Each of the plurality of CMOS inverters in the ring oscillator 20 has identical construction. Thus, only the structure of the first CMOS inverter is described here.

The first CMOS inverter includes a PMOS transistor PM1 connected in series with an NMOS transistor NM1 between a supply voltage VDD and a ground voltage Vss. The gates of the transistors PM1 and NM1 are connected to each other in parallel. An NMOS transistor NM21 has its gate connected to an input terminal Vin, its source connected to the respective gates of the PMOS transistor PM1 and NMOS transistor NM1, and its drain connected to an output terminal. The NMOS transistor NM21 can be replaced by a PMOS transistor.

Figure 3:
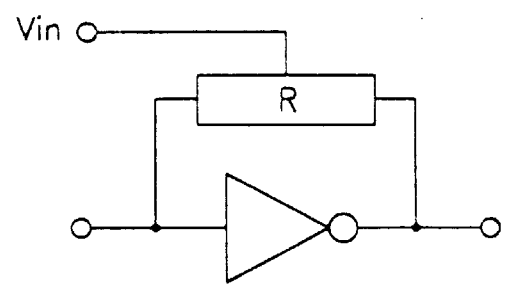
FIG. 3 is a schematic circuit diagram of a CMOS inverter amplifier in the circuit of FIG. 2.
Figure 4:
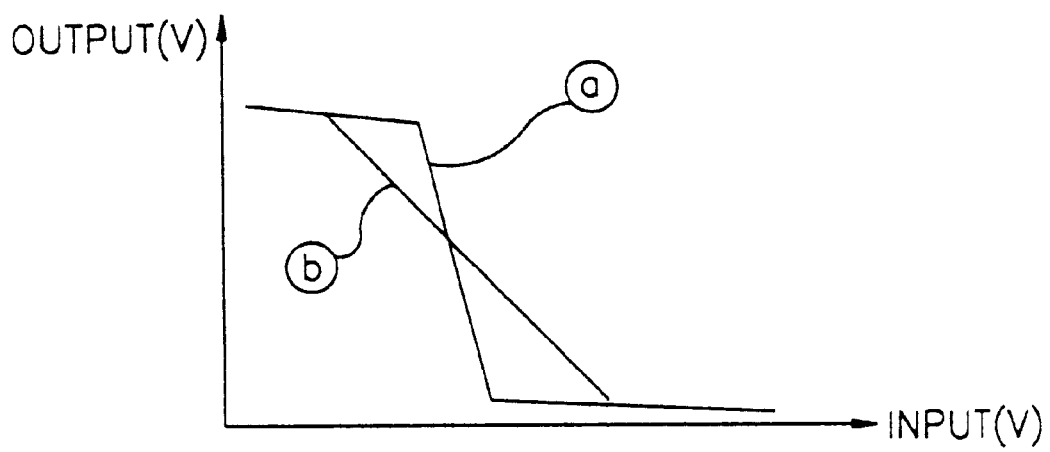
FIG. 4 is a graph illustrating transfer characteristics of the CMOS inverter amplifier in the circuit of FIG. 3.

The operation of the voltage control oscillator according to the present invention will now be described. As mentioned above, the plurality of inverters of the ring oscillator 20 each respectively has a CMOS inverter amplifier as a basic unit and the number of the inverters is N(here, N=1, 2, ... n). Therefore, each of the inverters can be depicted as the equivalent CMOS inverter amplifier circuit shown in FIG. 3, and a transfer characteristic curve with regard to the CMOS inverter amplifier can be depicted by FIG. 4. The slope of the transfer characteristic curve "a" illustrates a high gain and curve "b" shows a low gain, wherein each slope is determined by the value of resistance R in FIG. 3. In other words, an increase in R leads to an increased gain, and vice versa. When R becomes zero, i.e., there is a short circuit between the input and output, the gain becomes "1" (unity).

Consequently, the present invention varies R in accordance with the input voltage Vin to change the gain of the CMOS inverter amplifier, thereby changing the free running frequency. In other words, an increase in the input voltage Vin applied to the NMOS transistors NM21, . . . NM2n decreases R. When NMOS transistor NM21, . . . NM2n become turned on, R is further decreased to be "1", and this minimizes the output frequency.

Figure 5:
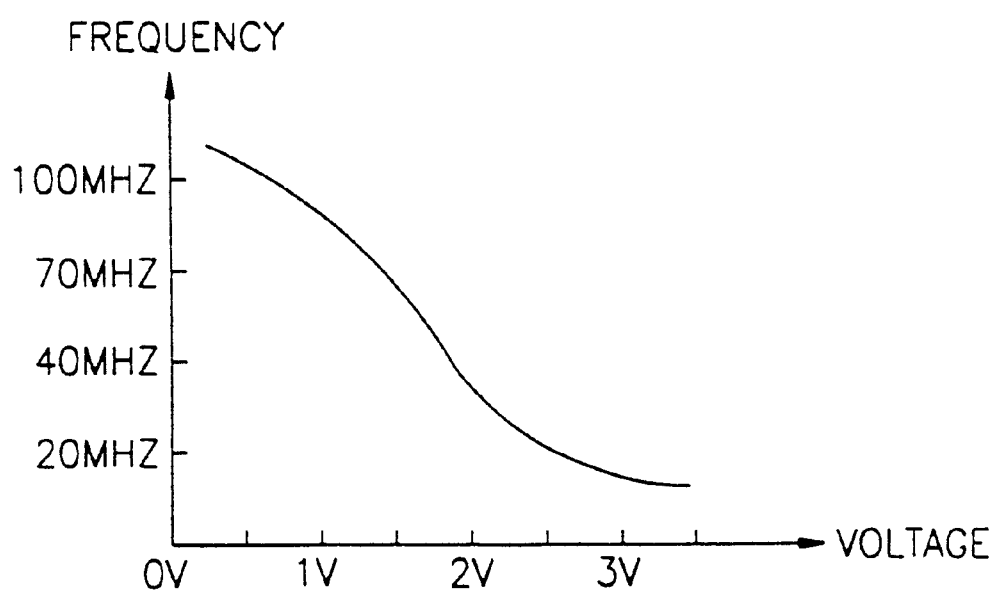
FIG. 5 is a graph illustrating an output frequency with regard to an input voltage of the VCO according to the present invention.

FIG. 5 shows the output frequency variation in accordance with the variation of the input voltage Vin ranging from 0V to 3V. As shown in FIG. 5, a high frequency output is generated by the VCO operating at the low voltage ranging from 0V to 3V. For example, a high frequency output in a range between approximately 20 MHz and approximately 100 MHz may be generated when the VCO is operating with a low input voltage in a range between approximately 3V and approximately 0V.

The VCO according to the present invention has the following advantages. The gain of the CMOS inverter amplifiers in the VCO changes accordingly when the input voltage Vin changes. As a result, a free running frequency also changes accordingly. Thus, a high frequency oscillation can be generated while enabling the VCO to be operated at a low voltage variation ranging from 0V to 3V. In addition, the present invention satisfies an oscillation function at a minimum supply voltage, thus suitable for application to all circuits employing a phase locked loop (PLL).

It will be apparent to those skilled in the art that various modifications and variations can be made in the voltage controlled oscillator of the present invention without departing from the spirit or scope of the invention. Thus, it is intended that the present invention cover the modifications and variations of this invention provided they come within the scope of the appended claims and their equivalents.

What is claimed is:

1. A voltage controlled oscillator (VCO), comprising:
a ring oscillator controlled by an input voltage and having a ring structure, the ring oscillator including a plurality of CMOS inverter amplifiers each having an input, an output, and a MOS feedback transistor with a gate connected to the input voltage and source and drain connected respectively to the input and output, the output of a CMOS inverter amplifier being connected to the input of a next CMOS inverter amplifier; and
an inverter for inverting an output value of the ring oscillator,
wherein the ring oscillator generates a free running frequency which changes in accordance with the input voltage, and the voltage controlled oscillator generates a higher frequency output with a lower input voltage.

2. The voltage controlled oscillator of claim 1, wherein each of the plurality of CMOS inverter amplifiers further includes
a PMOS transistor and a first NMOS transistor connected in series between a supply voltage and a ground voltage,
wherein a gate of the PMOS transistor and a gate of the first NMOS transistor are connected to each other and to the input of the CMOS inverter amplifier, and the MOS feedback transistor is a second NMOS transistor.

3. The voltage controlled oscillation of claim 1, wherein each of the plurality of CMOS inverter amplifiers includes
a first PMOS transistor and a NMOS transistor connected in series between a supply voltage and a ground voltage,
wherein a gate of the first PMOS transistor and a gate of the NMOS transistor are connected to each other and to the input of the CMOS inverter amplifier, and the MOS feedback transistor is a second PMOS transistor.

4. The voltage controlled oscillator of claim 1, wherein the output of a last CMOS inverter amplifier is connected to the input of a first CMOS inverter amplifier, and connected to an input of the inverter.

5. The voltage controlled oscillator of claim 1, wherein the voltage controlled oscillator generates a frequency output in a range of approximately 20 MHZ to approximately 100 MHZ when the input voltage is in a range of approximately 3V to approximately 0V.

6. A voltage controlled oscillator (VCO), comprising:
a ring oscillator controlled by an input voltage and having a plurality of CMOS inverter amplifiers connected in a ring structure, wherein each CMOS inverter amplifier includes an input, an output, and a MOS feedback transistor connected between the input and output, the output of each CMOS inverter amplifier being connected to the input of a next CMOS inverter amplifier,
wherein the ring oscillator generates a free running frequency which changes in accordance with the input voltage, and the voltage controlled oscillator generates a higher frequency output with a lower input voltage.

7. The voltage controlled oscillator of claim 6, further comprising an inverter for inverting an output value of the ring oscillator.

8. The voltage controlled oscillator of claim 7, wherein the output of a last CMOS inverter amplifier in the ring oscillator is connected to the input of a first CMOS inverter amplifier and to an input of the inverter.

9. The voltage controlled oscillator of claim 6, wherein the input voltage is supplied to the gate of the feedback transistor in each of the CMOS inverter amplifiers.

10. The voltage controlled oscillator of claim 6, wherein the source and drain of the MOS feedback transistor are respectively connected to the input and output of a corresponding CMOS inverter amplifier.

11. The voltage controlled oscillator of claim 6, wherein each of the plurality of CMOS inverter amplifiers includes a PMOS transistor and a first NMOS transistor connected in series between a supply voltage and a ground voltage, wherein a gate of the PMOS transistor and a gate of the first NMOS transistor are connected to each other to form the input of the CMOS inverter amplifier, and
wherein the MOS feedback transistor is a second NMOS transistor having a gate connected to the input voltage, a source connected to the input of the CMOS inverter amplifier, and a drain connected to the output of the CMOS inverter amplifier.

12. The voltage controlled oscillation of claim 6, wherein each of the plurality of CMOS inverter amplifiers includes a first PMOS transistor and a NMOS transistor connected in series between a supply voltage and a ground voltage, wherein a gate of the first PMOS transistor and a gate of the NMOS transistor are connected to each other to form the input of the CMOS inverter amplifier, and
wherein the MOS feedback transistor is a second PMOS transistor having a gate connected to the input voltage, a source connected to the input of the CMOS inverter amplifier, and a drain connected to the output of the CMOS inverter amplifier.

13. The voltage controlled oscillator of claim 6, wherein the voltage controlled oscillator generates a frequency output in a range of about 20 MHZ to about 100 MHZ when the input voltage is in a range of about 3V to about 0V.

14. A voltage controlled oscillator (VCO), comprising:

a ring oscillator controlled by an input voltage and having a plurality of CMOS inverter amplifiers connected in a ring structure, wherein each of the plurality of CMOS inverter amplifiers includes an input and an output, a PMOS transistor and a NMOS transistor connected in series between a supply voltage and a ground voltage, wherein a gate of the PMOS transistor and a gate of the NMOS transistor are connected to each other to form the input of the CMOS inverter amplifier, and a feedback MOS transistor having a gate connected to the input voltage, a source connected to the input of the CMOS inverter amplifier, and a drain connected to the output of the CMOS inverter amplifier; and an inverter for inverting an output value of the ring oscillator, wherein the output of each CMOS inverter amplifier is connected to the input of a next CMOS inverter amplifier, and the output of a last CMOS inverter amplifier in the ring oscillator is connected to the input of a first CMOS inverter amplifier and to an input of the inverter, and wherein the ring oscillator generates a free running frequency which changes in accordance with the input voltage, and the voltage controlled oscillator generates a higher frequency output with a lower input voltage.

15. The voltage controlled oscillator of claim 14, wherein the feedback MOS transistor is a NMOS transistor.

16. The voltage controlled oscillator of claim 14, wherein the feedback MOS transistor is a PMOS transistor.

17. The voltage controlled oscillator of claim 14, wherein the voltage controlled oscillator generates a frequency output in a range of about 20 MHZ to about 100 MHZ when the input voltage is in a range of about 3V to about 0V.

* * * * *